US012648380B2

(12) United States Patent　(10) Patent No.:　US 12,648,380 B2
　Ko　(45) Date of Patent:　Jun. 2, 2026

(54) SUBSTRATE PROCESSING APPARATUS AND SUBSTRATE PROCESSING METHOD USING THE SAME

(71) Applicant: SAMSUNG ELECTRONICS CO., LTD., Suwon-si (KR)

(72) Inventor: Hyungsik Ko, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 253 days.

(21) Appl. No.: 18/357,725

(22) Filed: Jul. 24, 2023

(65) Prior Publication Data

US 2024/0096637 A1　Mar. 21, 2024

(30) Foreign Application Priority Data

Sep. 15, 2022　(KR) ......................... 10-2022-0116698
Feb. 21, 2023　(KR) ......................... 10-2023-0022954

(51) Int. Cl.
*H10P 50/24*　(2026.01)
*H01J 37/32*　(2006.01)
(Continued)

(52) U.S. Cl.
CPC ...... *H10P 50/242* (2026.01); *H01J 37/32091* (2013.01); *H01J 37/32449* (2013.01);
(Continued)

(58) Field of Classification Search
CPC ........... H01L 21/3065; H01L 21/67069; H01L 21/6831; H01L 21/68785; H01J 37/32091; H01J 37/32449; H01J 37/32522; H01J 37/32642; H10P 50/542; H10P 72/0421; H10P 72/72; H10P 72/7624
(Continued)

(56) References Cited

U.S. PATENT DOCUMENTS 6,300,226 B1　10/2001　Miyata et al.
7,842,189 B2　11/2010　Midorikawa
(Continued)

FOREIGN PATENT DOCUMENTS

JP　　2002003275　　1/2002
JP　　5751917　　7/2015
(Continued)

OTHER PUBLICATIONS

WO-02052628-A1, English machine translation (Year: 2002), Plasma Processing Method and Plasma Processor, Koshiishi, A. et al, Jul. 4, 2002.*

*Primary Examiner* — Anita K Alanko
(74) *Attorney, Agent, or Firm* — Morgan, Lewis & Bockius LLP

(57)　ABSTRACT

A substrate processing method includes classifying a kind of substrate treatment process in which a focus ring is used, classifying a plurality of focus rings, selecting from the classified plurality of focus rings a specific focus ring suitable for a certain substrate treatment process corresponding to the classified kind of substrate treatment process, and performing the certain substrate treatment process using the selected specific focus ring. The operation of classifying the plurality of focus rings includes classifying the plurality of focus rings into two or more grades.

13 Claims, 9 Drawing Sheets

(51) Int. Cl.

| | |
|---|---|
| *H10P 72/00* | (2026.01) |
| *H10P 72/72* | (2026.01) |
| *H10P 72/76* | (2026.01) |

(52) U.S. Cl.
CPC .. *H01J 37/32522* (2013.01); *H01J 37/32642* (2013.01); *H10P 72/0421* (2026.01); *H10P 72/72* (2026.01); *H10P 72/7624* (2026.01)

(58) Field of Classification Search
USPC ......................................... 156/345.1–345.55
See application file for complete search history.

(56) References Cited

U.S. PATENT DOCUMENTS

| | | | |
|---|---|---|---|
| 8,202,621 B2 | 6/2012 | Pickering et al. | |
| 8,221,579 B2 | 7/2012 | Nagayama et al. | |
| 9,975,779 B2 | 5/2018 | Sugihara et al. | |
| 10,455,682 B2 | 10/2019 | Shipulski et al. | |
| 12,094,693 B2 * | 9/2024 | Pei .................... | H01J 37/32642 |
| 2009/0078196 A1 | 3/2009 | Midorikawa | |
| 2012/0252141 A1 | 10/2012 | Sundararajan et al. | |
| 2013/0264320 A1 | 10/2013 | Shipulski et al. | |
| 2019/0267217 A1 * | 8/2019 | Nagaiwa ........... | H01J 37/32642 |
| 2021/0163301 A1 | 6/2021 | Park et al. | |
| 2024/0101486 A1 | 3/2024 | Walker et al. | |
| 2024/0308918 A1 * | 9/2024 | Walker .............. | H01J 37/32651 |
| 2025/0188603 A1 * | 6/2025 | Kim .................. | H01L 21/02529 |

FOREIGN PATENT DOCUMENTS

| | | | | |
|---|---|---|---|---|
| KR | 10-1209110 | 11/2012 | | |
| KR | 10-1268875 | 5/2013 | | |
| KR | 10-1308907 | 9/2013 | | |
| KR | 10-1575348 | 12/2015 | | |
| KR | 10-2201888 | 1/2021 | | |
| KR | 10-2218433 | 2/2021 | | |
| KR | 2216815 B1 | 2/2021 | | |
| KR | 10-2293576 | 8/2021 | | |
| TW | 201130390 | 9/2011 | | |
| TW | 202231600 | 8/2022 | | |
| WO | WO-02052628 A1 * | 7/2002 | ........ | H01J 37/32642 |
| WO | WO2022154936 A2 | 7/2022 | | |

* cited by examiner

SUBSTRATE PROCESSING APPARATUS AND SUBSTRATE PROCESSING METHOD USING THE SAME

CROSS-REFERENCE TO RELATED APPLICATIONS

This U.S. nonprovisional application claims priority under 35 U.S.C § 119 to Korean Patent Applications No. 10-2022-0116698 filed on Sep. 15, 2022 and No. 10-2023-0022954 filed on Feb. 21, 2023 in the Korean Intellectual Property Office, the disclosures of which are hereby incorporated by reference in their entirety.

TECHNICAL FIELD

Embodiments of the present inventive concept relate to a substrate processing apparatus and a substrate processing method using the same, and more particularly, to a substrate processing apparatus in which components are sorted by grade and used for their proper process and a substrate processing method using the same.

DISCUSSION OF RELATED ART

A semiconductor device may be fabricated by using various processes. For example, a semiconductor device may be manufactured by allowing a silicon wafer to undergo a photolithography process, an etching process, a deposition process, and so forth. Various fluids may be used in such processes. For example, plasma may be used in an etching process and/or a deposition process. A focus ring may be used to control the plasma.

SUMMARY

Some embodiments of the present inventive concept provide a substrate processing apparatus that can uniformly control plasma in an edge region and a substrate processing method using the same.

Some embodiments of the present inventive concept provide a substrate processing apparatus configured to use its components suitable for each process and a substrate processing method using the same.

Some embodiments of the present inventive concept provide a substrate processing apparatus that can increase a yield and a substrate processing method using the same.

Objects of the present inventive concept are not limited to those mentioned above.

According to some embodiments of the present inventive concept, a substrate processing method includes classifying a kind of substrate treatment process in which a focus ring is used, classifying a plurality of focus rings, selecting, from the classified plurality of focus rings, a specific focus ring suitable for a certain substrate treatment process corresponding to the classified kind of substrate treatment process, and performing the certain substrate treatment process using the selected specific focus ring. The operation of classifying the plurality of focus rings includes classifying the plurality of focus rings into two or more grades.

According to some embodiments of the present inventive concept, a substrate processing method includes classifying a component according to grade, the component being used for a substrate processing apparatus, classifying a substrate treatment process, selecting a component having a grade suitable for the classified substrate treatment process, placing the selected component into the substrate processing apparatus, loading a substrate into the substrate processing apparatus, and performing a process on the substrate. The operation of classifying the component according to grade includes classifying the grade of the component based on a grain size.

According to some embodiments of the present inventive concept, a substrate processing apparatus includes a process chamber that provides a process space, a chuck disposed in the process space and that supports a substrate, and a focus ring disposed on the chuck. A grain size of the focus ring is equal to or less than about 14.23 μm. An electrical resistivity of the focus ring is equal to or less than about 1Ω.

BRIEF DESCRIPTION OF DRAWINGS

The above and other features of the present inventive concept will become more apparent by describing in detail embodiments thereof with reference to the accompanying drawings.

DETAILED DESCRIPTION OF EMBODIMENTS

Figure 1:
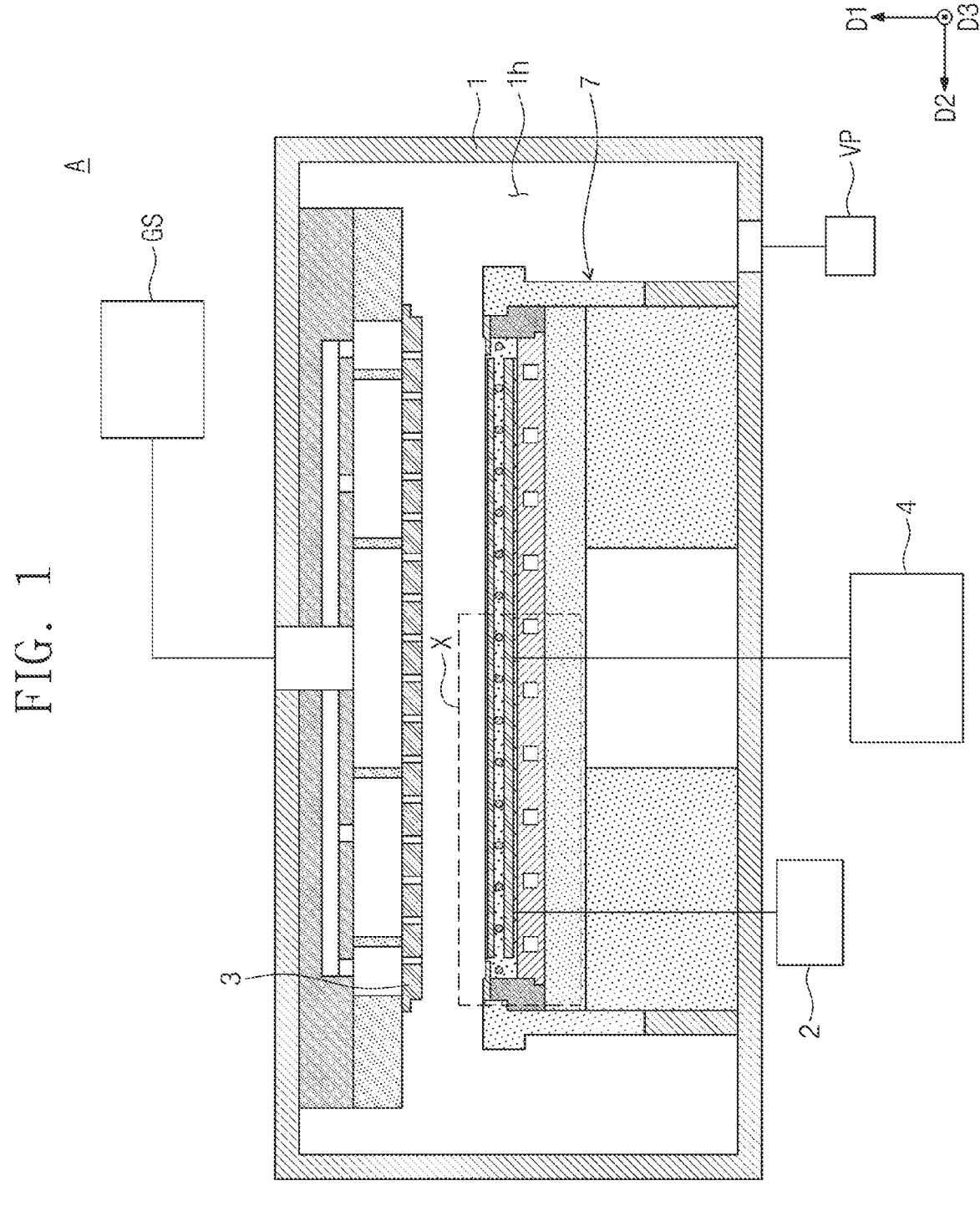
FIG. 1 illustrates a cross-sectional view showing a substrate processing apparatus according to some embodiments of the present inventive concept.

Embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

The term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art. Other uses of these terms and similar terms to describe the relationships between components should be interpreted in a like fashion.

FIG. 1 illustrates a cross-sectional view showing a substrate processing apparatus according to some embodiments of the present inventive concept.

In this description, symbol D1 may indicate a first direction, symbol D2 may indicate a second direction that intersects the first direction D1, and symbol D3 may indicate a third direction that intersects each of the first direction D1 and the second direction D2. The first direction D1 may be called a vertical direction. Each of the second direction D2 and the third direction D3 may be called a horizontal direction.

Referring to FIG. 1, a substrate processing apparatus A may be provided. The substrate processing apparatus A may be configured to allow a substrate to undergo an etching process and/or a deposition process. The term "substrate" used in this description may denote a silicon (Si) wafer, but the present inventive concept is not limited thereto. The substrate processing apparatus A may use plasma to treat a substrate. The substrate processing apparatus A may generate plasma in various ways. For example, the substrate processing apparatus A may be a capacitively coupled plasma (CCP) apparatus and/or an inductively coupled plasma (ICP) apparatus. For convenience of explanation, the following will illustrate and discuss a CCP type substrate processing apparatus. The substrate processing apparatus A may include a process chamber 1, a stage 7, a showerhead 3, a direct-current (DC) power generator 2, a radio-frequency (RF) power generator 4, a vacuum pump VP, and a gas supply device GS.

The process chamber 1 may provide a process space $1h$. A substrate treatment process may be performed in the process space $1h$. The process space $1h$ may be separated from an external space. During a substrate treatment process, the process space $1h$ may be in a substantial vacuum state. The process chamber 1 may have a cylindrical shape, but the present inventive concept is not limited thereto.

The stage 7 may be positioned in the process chamber 1. For example, the stage 7 may be positioned in the process space $1h$. The stage 7 may support and/or fix a substrate. A substrate treatment process may be performed in a state where a substrate is placed on the stage 7. The stage 7 will be described further below.

The showerhead 3 may be positioned in the process chamber 1. For example, the showerhead 3 may be positioned in the process space $1h$. The showerhead 3 may be upwardly spaced apart from the stage 7. For example, a portion of the process space $1h$ may be disposed between the showerhead 3 and the stage 7 A gas supplied from the gas supply device GS may be uniformly sprayed through the showerhead 3 into the process space $1h$. The showerhead 3 will be described in further detail below.

The DC power generator 2 may apply a DC power to the stage 7. The DC power applied from the DC power generator 2 may rigidly place a substrate in a certain position on the stage 7.

The RF power generator 4 may supply RF power to the stage 7. It may thus be possible to control plasma in the process space $1h$. A detailed description thereof will be described further below.

The vacuum pump VP may be connected to the process space $1h$. The vacuum pump VP may apply a vacuum pressure to the process space $1h$ during a substrate treatment process.

The gas supply device GS may supply the process space $1h$ with gas. The gas supply device GS may include, for example, a gas tank, a compressor, and a valve. The plasma may be generated from a portion of gas supplied from the gas supply device GS to the process space $1h$.

Figure 2:
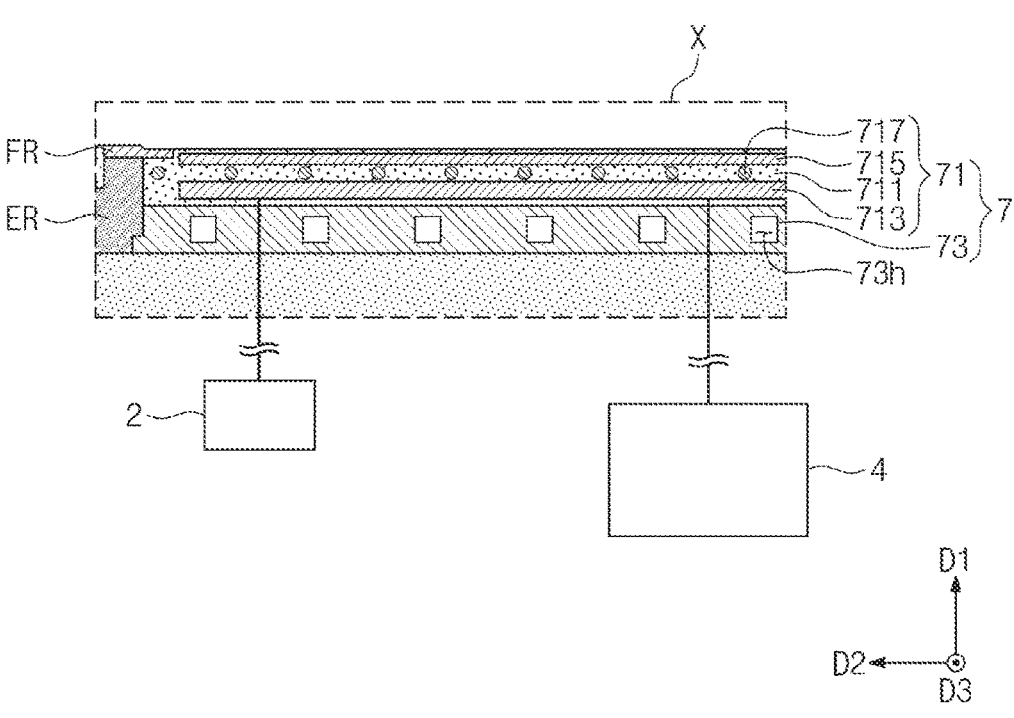
FIG. 2 illustrates an enlarged cross-sectional view showing section X of FIG. 1.
Figure 3:
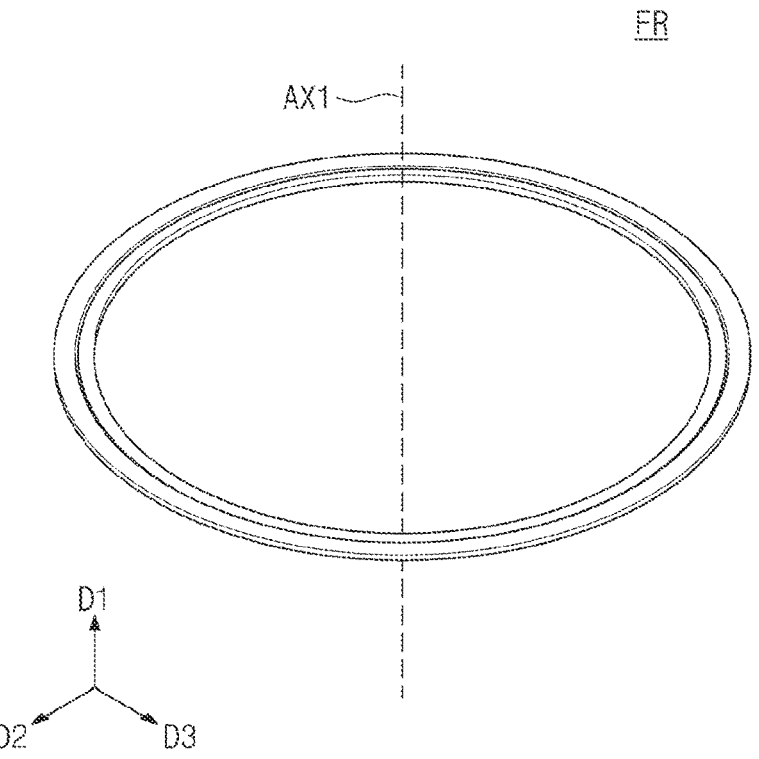
FIG. 3 illustrates a perspective view showing a focus ring according to some embodiments of the present inventive concept.
Figure 4:
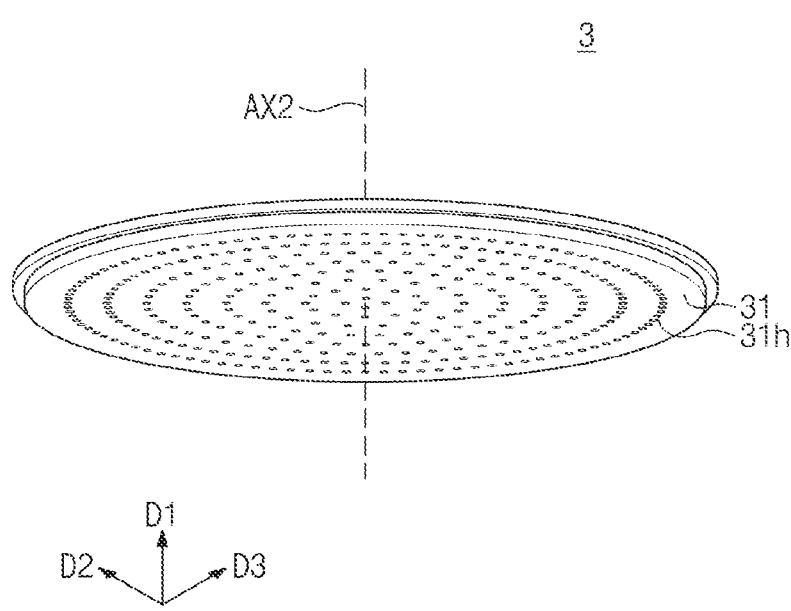
FIG. 4 illustrates a perspective view showing a showerhead according to some embodiments of the present inventive concept.

FIG. 2 illustrates an enlarged cross-sectional view showing section X of FIG. 1. FIG. 3 illustrates a perspective view showing a focus ring according to some embodiments of the present inventive concept. FIG. 4 illustrates a perspective view showing a showerhead according to some embodiments of the present inventive concept.

Referring to FIG. 2, the substrate processing apparatus (see A of FIG. 1) may further include a focus ring FR and an edge ring ER. The stage 7 may include a chuck 71 and a cooling plate 73.

A substrate may be disposed on the chuck 71. The chuck 71 may fix a substrate in a certain position thereon. The chuck 71 may include a chuck body 711, a plasma electrode 713, a chuck electrode 715, and a heater 717.

The chuck body 711 may have a cylindrical shape. The chuck body 711 may include a ceramic, but the present inventive concept is not limited thereto. A substrate may be disposed on a top surface of the chuck body 711.

The plasma electrode 713 may be positioned in the chuck body 711. The plasma electrode 713 may include aluminum (Al). The plasma electrode 713 may have a disk shape, but the present inventive concept is not limited thereto. RF power may be applied to the plasma electrode 713. For example, the RF power generator 4 may apply RF power to the plasma electrode 713. The RF power applied to the plasma electrode 713 may control plasma in the process space (see $1h$ of FIG. 1).

The chuck electrode 715 may be positioned in the chuck body 711. The chuck electrode 715 may be positioned higher than the plasma electrode 713. DC power may be applied to the chuck electrode 715. For example, the DC power generator 2 may apply DC power to the chuck electrode 715. The DC power applied to the chuck electrode 715 may rigidly place a substrate in a certain position on the chuck body 711. The chuck electrode 715 may include aluminum (Al), but the present inventive concept is not limited thereto.

The heater 717 may be positioned in the chuck body 711. The heater 717 may be positioned between the chuck electrode 715 and the plasma electrode 713. The heater 717 may include a hot wire. For example, the heater 717 may include a concentrically circular shaped hot wire. The heater 717 may radiate heat to the surrounding environment. Therefore, the chuck body 711 may have an increased temperature.

The cooling plate 73 may be positioned below the chuck 71. For example, the chuck 71 may be positioned on the cooling plate 73. The cooling plate 73 may provide a cooling hole $73h$. Cooling water may flow in the cooling hole $73h$. The cooling water in the cooling hole $73h$ may absorb heat from the cooling plate 73.

The edge ring ER may surround the chuck body 711.

Referring to FIGS. 2 and 3, the focus ring FR may be positioned on the stage 7 and/or the edge ring ER. The focus ring FR may be detachable from the stage 7 and/or the edge ring ER. The focus ring FR may have a first axis AX1 that extends in the first direction D1. The focus ring FR may have a ring shape about the first axis AX1. The focus ring FR may include silicon carbide (SiC). The present inventive concept, however, is not limited thereto, and the focus ring FR may include silicon (Si) or any other suitable material.

Referring to FIG. 4, the showerhead 3 may include a head body 31. The head body 31 may have a disk shape. The head body 31 may have a second axis AX2 that extends in the first direction D1 (e.g., extends lengthwise in the first direction D1). The second axis AX2 may be identical to the first axis (see AX1 of FIG. 3), but the present inventive concept is not limited thereto. The head body 31 may provide a gas hole 31*h*. The gas hole 31*h* may penetrate in the first direction D1 through the head body 31. The gas hole 31*h* may be provided in plural. The plurality of gas holes 31*h* may be spaced apart from each other in a horizontal direction. For convenience of explanation, a single gas hole 31*h* will be described below, and it is to be understood that the description of the single gas hole 31*h* may apply to the plurality of gas holes. The showerhead 3 may include silicon carbide (SiC). For example, the head body 31 may include silicon carbide (SiC). The present inventive concept, however, is not limited thereto, and the showerhead 3 may include silicon (Si) or any other suitable material.

Figure 5:
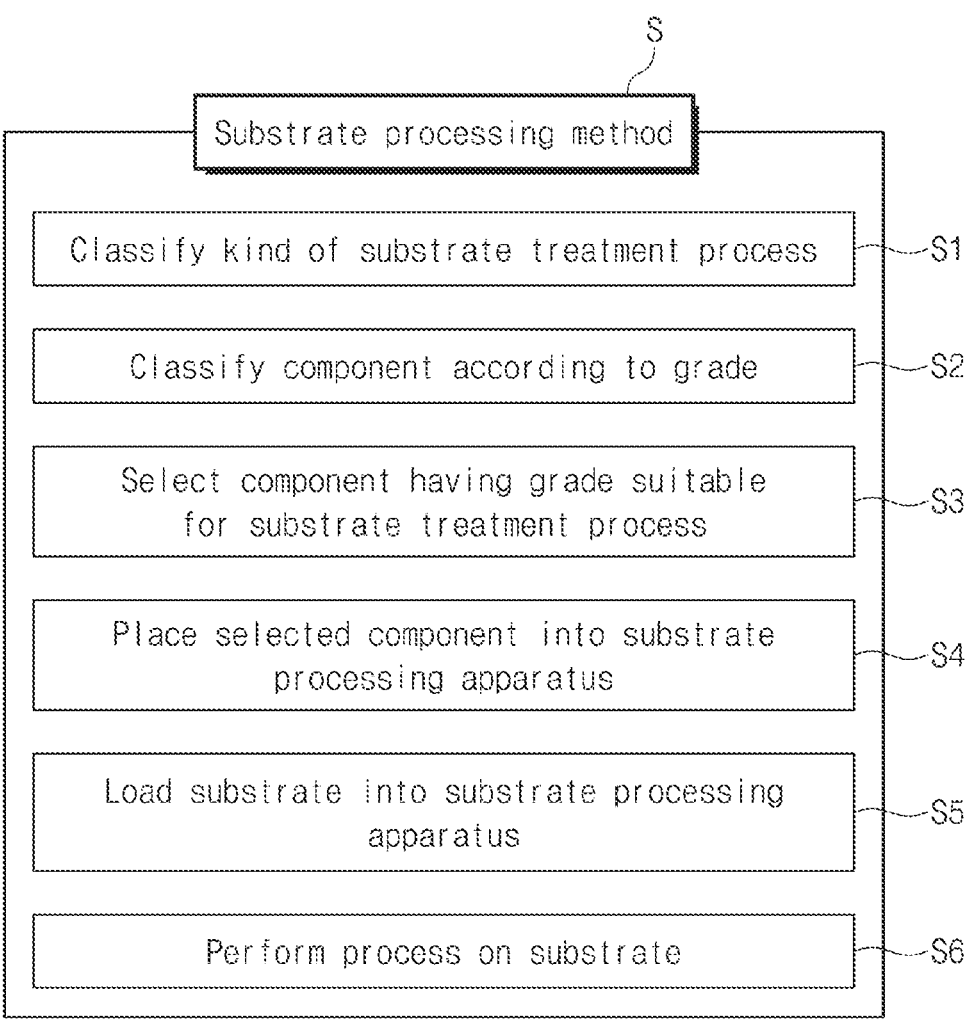
FIG. 5 illustrates a flowchart showing a substrate processing method according to some embodiments of the present inventive concept.

FIG. 5 illustrates a flowchart showing a substrate processing method according to some embodiments of the present inventive concept.

Referring to FIG. 5, a substrate processing method S may be provided. The substrate processing method S may be a method of treating a substrate by using the substrate processing apparatus A discussed with reference to FIGS. 1 to 4. The substrate processing method S may include classifying a substrate treatment process according to kind (or type) (S1), classifying components according to grade (S2), selecting a component suitable for the substrate treatment process (S3), placing the selected component into a substrate processing apparatus (S4), loading a substrate into the substrate processing apparatus (S5), and performing a process on the substrate (S6).

The process classification operation S1 may include classifying the substrate treatment process into two or more grades. The substrate treatment process may include, for example, an etching process. In the process classification operation S1, an etching process may be classified into two or more grades according to a kind (or type) of substrate. A substrate treatment process may be classified based on a process difficulty. For example, a high aspect ratio contact (HARC) etching process may be classified as a relatively high process difficulty. A high-difficulty process may be implemented with a high-quality component.

The component classification operation S2 may include classifying a component into two or more grades. A component may be a constituent used for a substrate treatment process. A component may be, for example, the focus ring (see FR of FIG. 2) and/or the showerhead (see 3 of FIG. 1). The present inventive concept, however, is not limited thereto, and a component may indicate another constituent used for a substrate treatment process.

A component may be classified based on various criteria. For example, a component may be classified based on a grain size, an electrical resistivity, and/or a transmittance.

When a component is classified based on a grain size, a grade A may be given (or assigned to a component whose grain size is equal to or less than a first grain size. A grade B may be given (or assigned) to a component whose grain size is greater than the first grain size and equal to or less than a second grain size. A grade C may be given (or assigned) to a component whose grain size is greater than the second grain size. The grade A may be ranked higher than the grade B. The grade B may be ranked higher than the grade C. The first grain size may be smaller than the second grain size. The third grain size may be larger than the second grain size. The first grain size may be, for example, about 9.01 μm. The second grain size may be, for example, about 11.42 μm. The third grain size may be, for example, about 14.23 μm. The present inventive concept, however, is not limited to the values mentioned above. The grain size may be measured in various ways. For example, a separate instrument may be used to measure grain sizes of components.

When a component is classified based on an electrical resistivity, a component whose resistivity is equal to or less than about $0.01\Omega$ may be classified as the grade A. A component whose resistivity is greater than about $0.01\Omega$ and less than about $1\Omega$ may be classified as the grade B. A component whose resistivity is greater than about $1\Omega$ may be classified as the grade C.

When a component is classified based on a transmittance, a component having a relatively lower transmittance may be classified as higher grade. The transmittance may be measured in various ways. For example, a specific transmittance meter may be used to measure transmittances of components.

As described herein, components may be classified based on for example, a grain size, an electrical resistivity, and/or a transmittance. However, the present inventive concept is not limited thereto. For example, a component may be classified based on other physical properties according to embodiments.

The component selection operation S3 may include matching a process grade and a component grade with each other. For example, a specific component may be selected which is suitable for a certain substrate treatment process. A component with a high grade may be used for a high-difficulty process. For example, a component classified as the grade A may be used for the HARC process.

A substrate processing method performed by using a specific component suitable for a certain substrate treatment process will be described in detail below.

FIGS. 6 to 10 illustrate cross-sectional views showing a substrate processing method according to the flowchart of FIG. 5.

Figure 6:
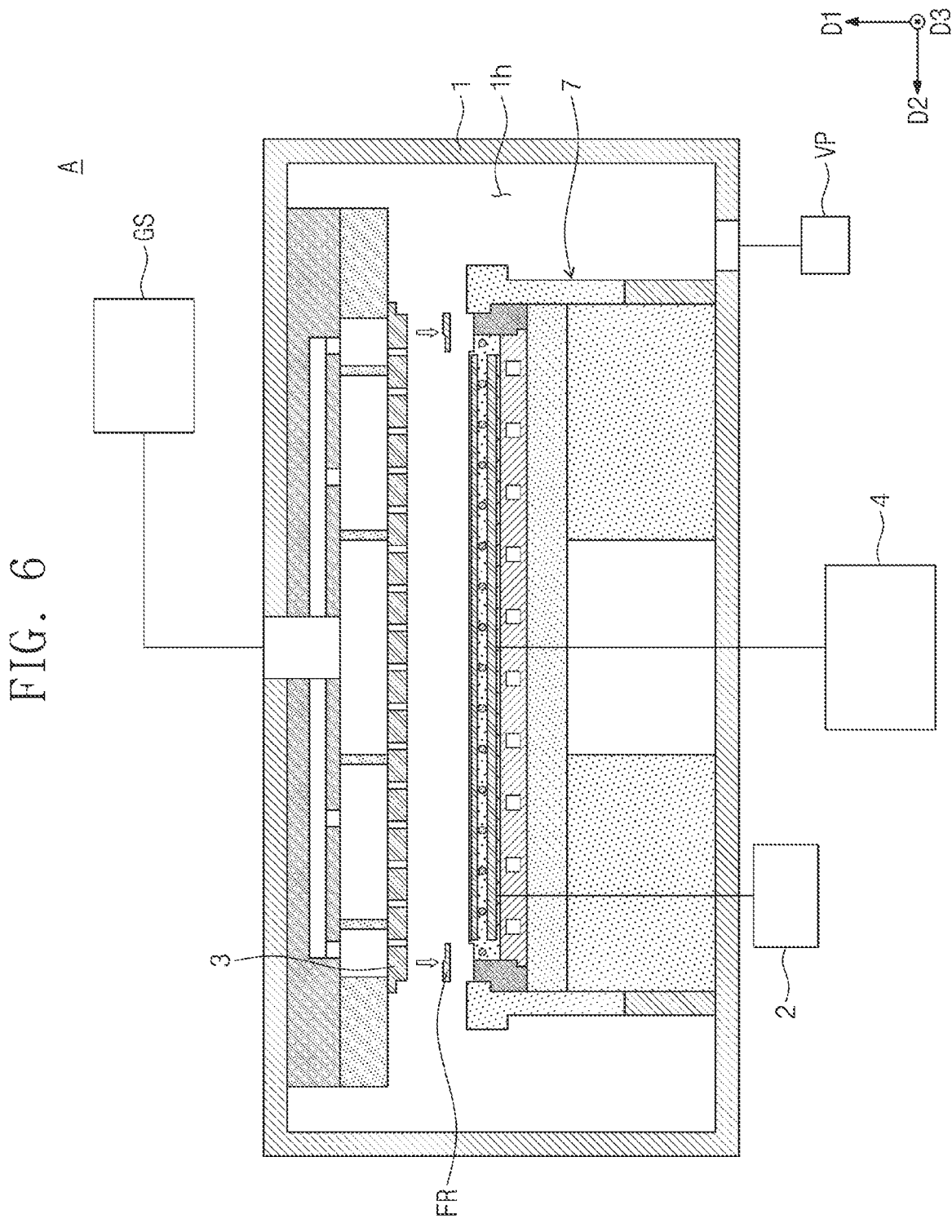
FIGS. 6 to 10 illustrate cross-sectional views showing a substrate processing method according to the flowchart of FIG. 5.

Referring to FIGS. 5 and 6, the component placement operation S4 may include allowing the stage 7 to receive thereon the focus ring FR specifically selected as being suitable for a grade of a substrate treatment process. It is discussed with reference to FIG. 6 that a component is the focus ring FR, but the present inventive concept is not limited thereto. For example, the showerhead 3 may be selected through the procedure described with reference to FIG. 5. The focus ring FR may be attached onto the stage 7. Alternatively, according to embodiments, the focus ring FR may be disposed on the stage 7 without using a separate adhesive means.

Figure 7:
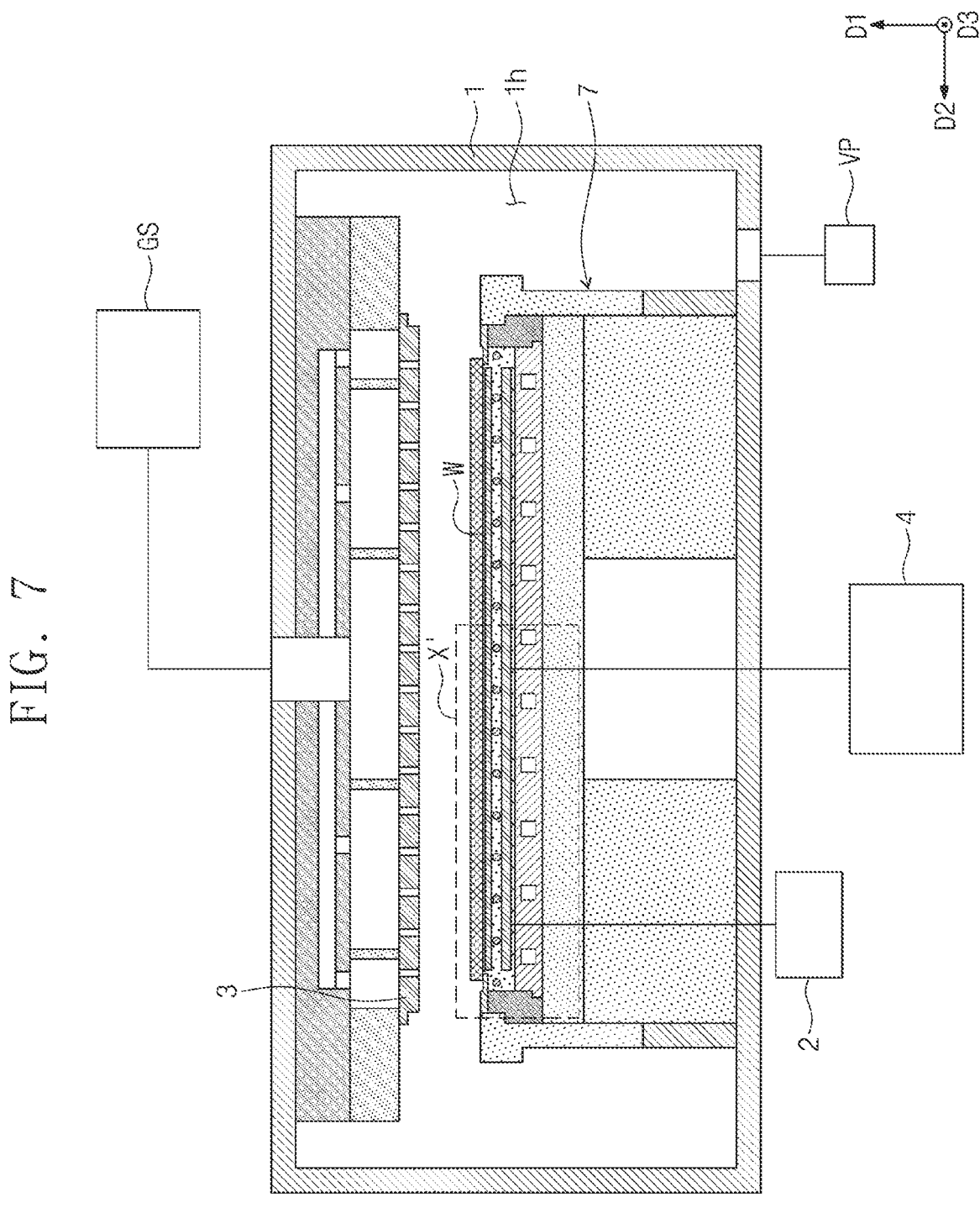
Figure 8:
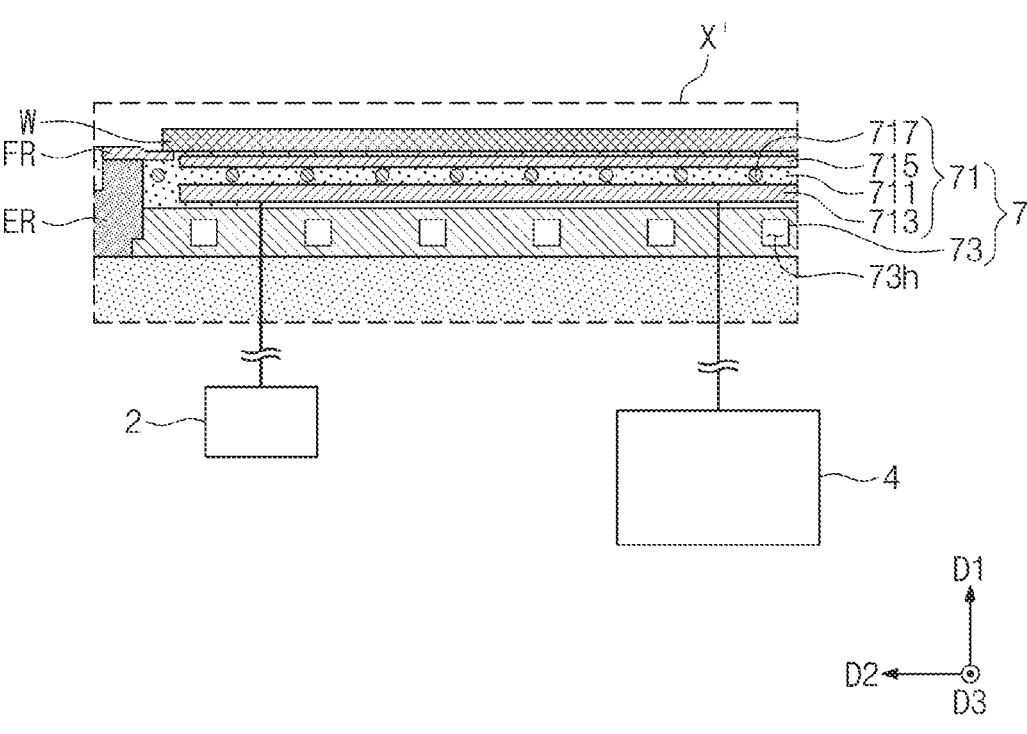

Referring to FIGS. 5, 7, and 8, the substrate loading operation S5 may include placing the substrate W on the stage 7. The substrate W may include a silicon (Si) wafer, but the present inventive concept is not limited thereto. The substrate W may be fixed onto the chuck 71. For example, when a direct-current (DC) voltage is applied to the chuck electrode 715, the substrate W may be fixed in a certain position on the top surface of the chuck body 711.

Figure 9:
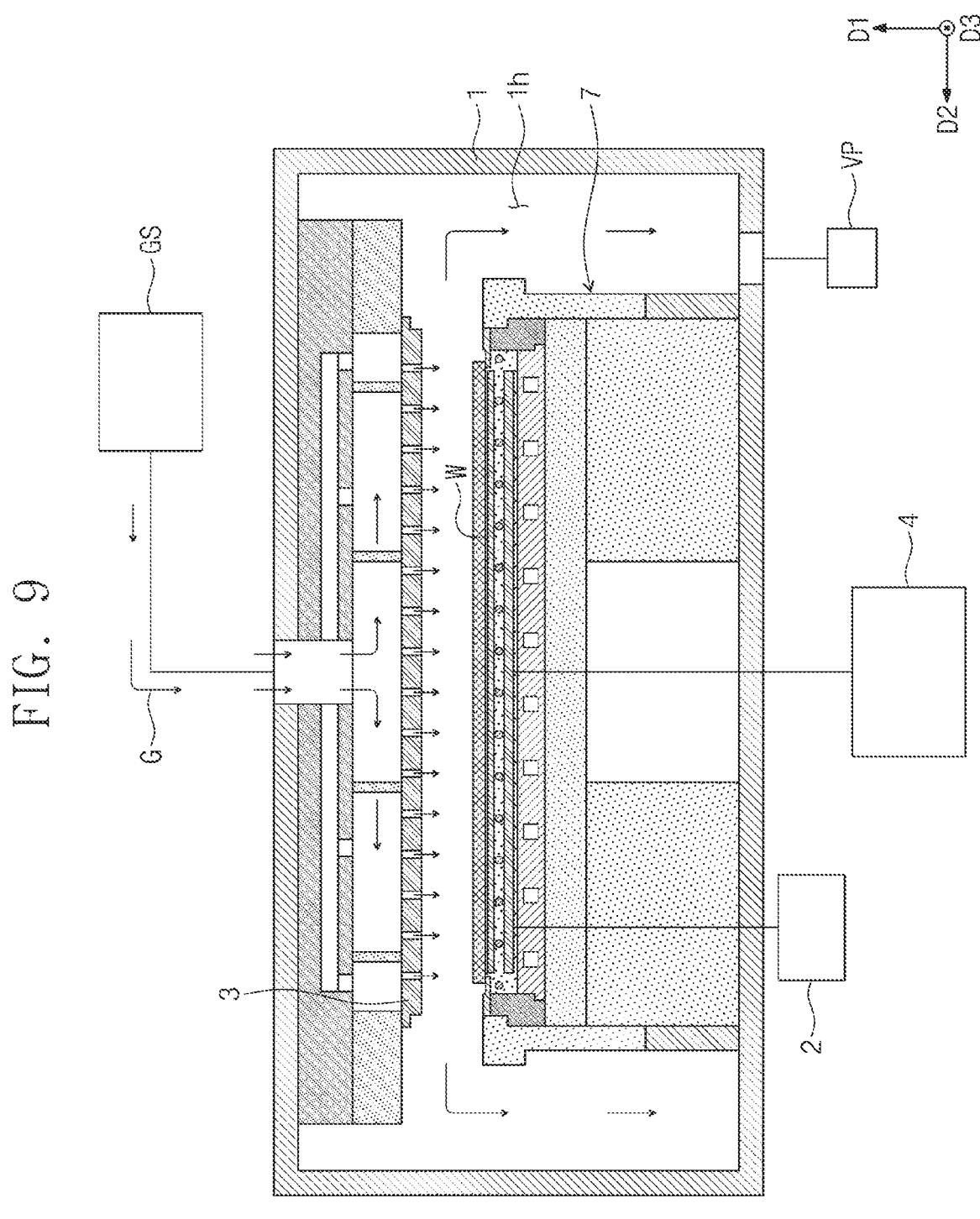

Referring to FIGS. 5 and 9, the substrate process operation S6 may include supplying the process space 1*h* with a process gas G. The process gas G supplied from the gas supply device GS may be distributed through the showerhead 3 onto the substrate W.

Figure 10:
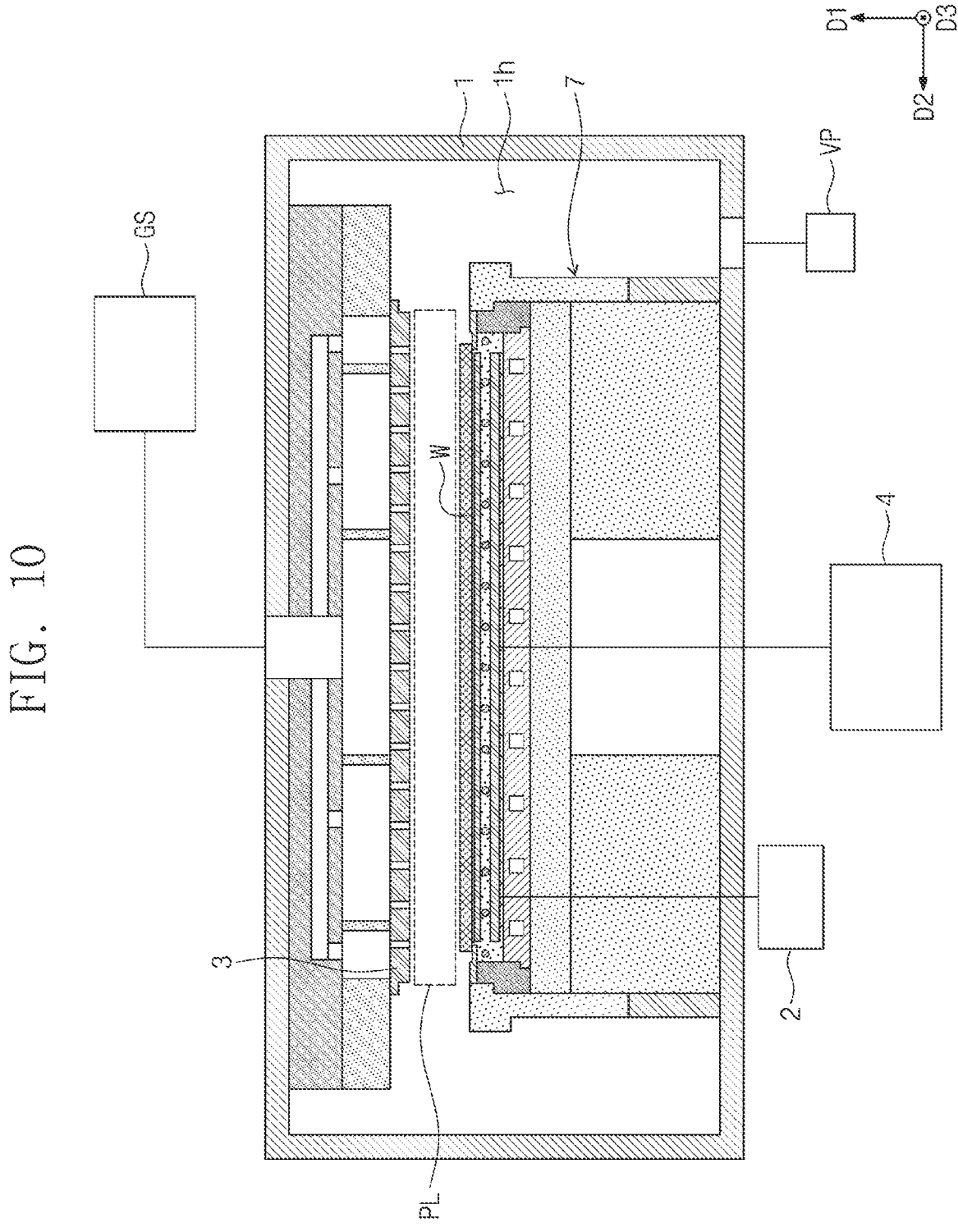

Referring to FIGS. 5 and 10, the substrate process operation S6 may include generating plasma PL. When radio-frequency (RF) power is applied from the RF power generator 4 to the plasma electrode 713, an electric field may be created in the process space 1*h*. The electric field created in the process space 1*h* may form the plasma PL from a portion of the process gas G provided in the process space 1*h*. The plasma PL may cause the substrate W to undergo a treatment process.

According to a substrate processing apparatus and a substrate processing method using the same in accordance with some embodiments of the present inventive concept, a component may be classified based on grade and used for a suitable substrate treatment process. For example, a focus ring with a grade A and/or a showerhead with a grade A may be used in a high-difficulty process such as a high aspect ratio contact (HARC) process. Therefore, a high-difficulty process may increase in yield.

According to a substrate processing apparatus and a substrate processing method using the same in accordance with some embodiments of the present inventive concept, a component with a grade B may be used in an ordinary process other than a high-difficulty process. Therefore, a component with a grade A may be prevented from being used in the ordinary process. Thus, it may be possible to reduce waste of components.

According to a substrate processing apparatus and a substrate processing method using the same in accordance with some embodiments of the present inventive concept, a component with a grade C may not be used. Accordingly, it may be possible to prevent a reduction in yield of a substrate due to low-quality components.

According to a substrate processing apparatus and a substrate processing method using the same in accordance with some embodiments of the present inventive concept, plasma may be uniformly controlled on an edge region.

According to a substrate processing apparatus and a substrate processing method using the same in accordance with some embodiments of the present inventive concept, it may be possible to use a component suitable for each process.

According to a substrate processing apparatus and a substrate processing method using the same in accordance with some embodiments of the present inventive concept, it may be possible to increase a yield.

While the present inventive concept has been particularly shown and described with reference to embodiments thereof, it will be understood by those of ordinary skill in the art that various changes in form and detail may be made therein without departing from the spirit and scope of the present inventive concept as defined by the following.

What is claimed is:

1. A substrate processing method, comprising:
classifying a kind of substrate treatment process, in which a focus ring is used, into two or more process grades;
classifying a plurality of focus rings into two or more component grades;
selecting, from the classified plurality of focus rings, a specific focus ring suitable for a certain substrate treatment process corresponding to the classified kind of substrate treatment process by matching a process grade of the certain substrate treatment process with a component grade of the specific focus ring; and
performing the certain substrate treatment process using the selected specific focus ring, wherein classifying the plurality of focus rings into two or more component grades comprises classifying the plurality of focus rings based on a grain size of each of the plurality of focus rings.

2. The substrate processing method of claim 1, wherein classifying the plurality of focus rings into two or more component grades comprises:
assigning a grade A to a focus ring whose grain size is equal to or less than a first grain size;
assigning a grade B to a focus ring whose grain size is greater than the first grain size and equal to less than a second grain size; and
assigning a grade C to a focus ring whose grain size is greater than the second grain size and equal to or less than a third grain size,
wherein the first grain size is smaller than the second grain size, and
wherein the third grain size is larger than the second grain size.

3. The substrate processing method of claim 2, wherein the first grain size is about 9.01 μm,
the second grain size is about 11.42 μm, and
the third grain size is about 14.23 μm.

4. The substrate processing method of claim 2, wherein the certain substrate treatment process is a contact etching process, and
the specific focus ring is assigned as the grade A.

5. The substrate processing method of claim 1, wherein classifying the plurality of focus rings into two or more component grades comprises classifying the plurality of focus rings based on an electrical resistivity of each of the plurality of focus rings.

6. The substrate processing method of claim 1, wherein classifying the plurality of focus rings into two or more component grades comprises classifying the plurality of focus rings based on a transmittance of each of the plurality of focus rings.

7. A substrate processing method, comprising:
classifying a component according to grade from among a plurality of components having two or more component grades, the component being used for a substrate processing apparatus;
classifying a substrate treatment process into two or more process grades;
selecting a component suitable for the classified substrate treatment process by matching a process grade of the classified substrate treatment process with a component grade of the component;
placing the selected component into the substrate processing apparatus;
loading a substrate into the substrate processing apparatus; and
performing a process on the substrate,
wherein classifying the component according to grade comprises classifying the component grade of the component based on a grain size.

8. The substrate processing method of claim 7, wherein classifying the component according to grade further comprises:
assigning a grade A to a component whose grain size is equal to or less than a first grain size; and
assigning a grade B to a component whose grain size is greater than the first grain size.

9. The substrate processing method of claim 8, wherein the first grain size is about 9.01 μm.

10. The substrate processing method of claim 8, wherein the classified substrate treatment process is a contact etching process.

11. The substrate processing method of claim 10, wherein a component used for the contact etching process is assigned as the grade A.

12. The substrate processing method of claim 7, wherein the selected component is a focus ring.

13. The substrate processing method of claim 7, wherein classifying the component according to grade further comprises classifying the component grade of the component based on an electrical resistivity of the component or a transmittance of the component.

* * * * *